(12) United States Patent
Liu et al.

(10) Patent No.: US 8,900,905 B1
(45) Date of Patent: Dec. 2, 2014

(54) MEMS DEVICE AND METHOD OF FORMING THE SAME

(71) Applicant: Taiwan Semiconductor Manufacturing Company Limited, Hsinchu (TW)

(72) Inventors: Yu-Chia Liu, Kaohsiung (TW); Chia-Hua Chu, Hsinchu County (TW); Jung-Huei Peng, Hsinchu Hsien (TW); Kuei-Sung Chang, Kaohsiung (TW); Chun-Wen Cheng, Hsinchu County (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 13/957,491

(22) Filed: Aug. 2, 2013

(51) Int. Cl.
*H01L 21/00* (2006.01)
*H01L 29/84* (2006.01)

(52) U.S. Cl.
USPC .................................. 438/53; 257/254

(58) Field of Classification Search
USPC ....... 257/417–419, 254, E29.324; 438/50–53
See application file for complete search history.

(56) References Cited

U.S. PATENT DOCUMENTS 7,357,035 B2 *  4/2008  Liu et al. ..................... 73/756

* cited by examiner

*Primary Examiner* — Calvin Lee
(74) *Attorney, Agent, or Firm* — Jones Day

(57) ABSTRACT

A method for forming a MEMS device is provided. The method includes the following operations of providing a substrate having a first portion and a second portion; fabricating a membrane type sensor on the first portion of the substrate using a double-side process; and fabricating a bulk silicon sensor on the second portion of the substrate.

18 Claims, 19 Drawing Sheets

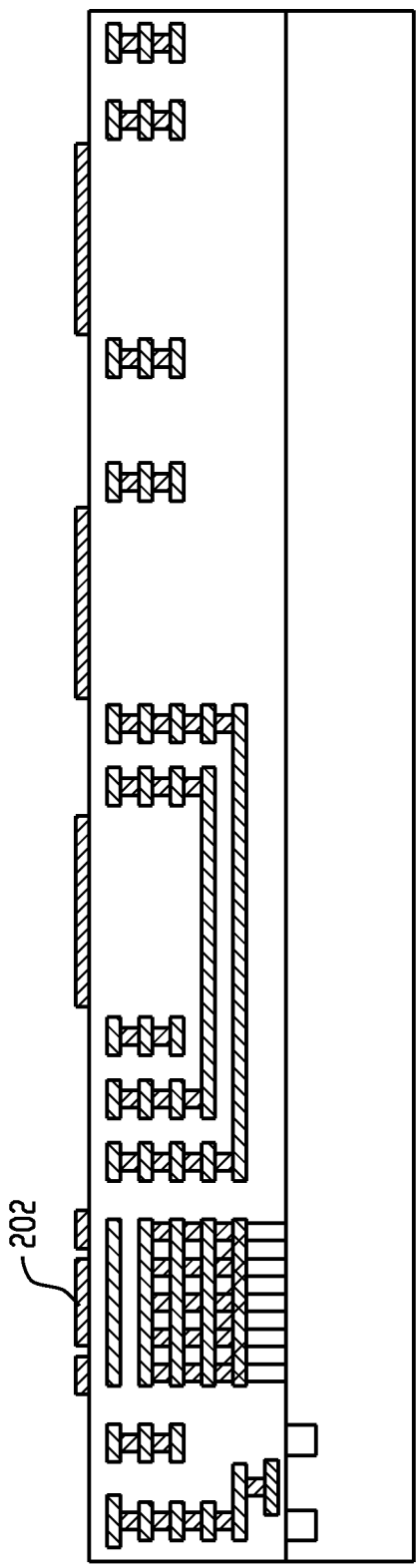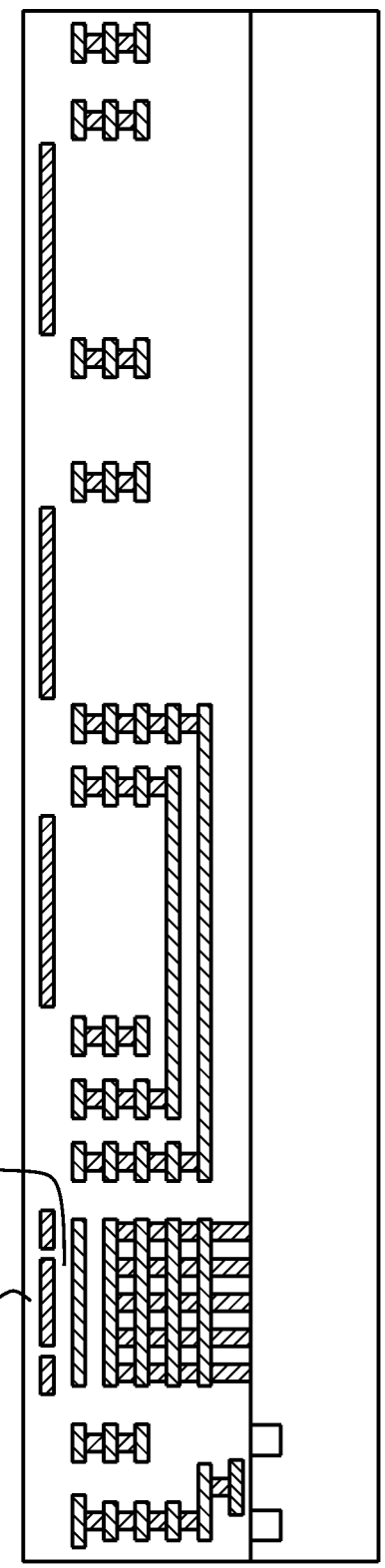

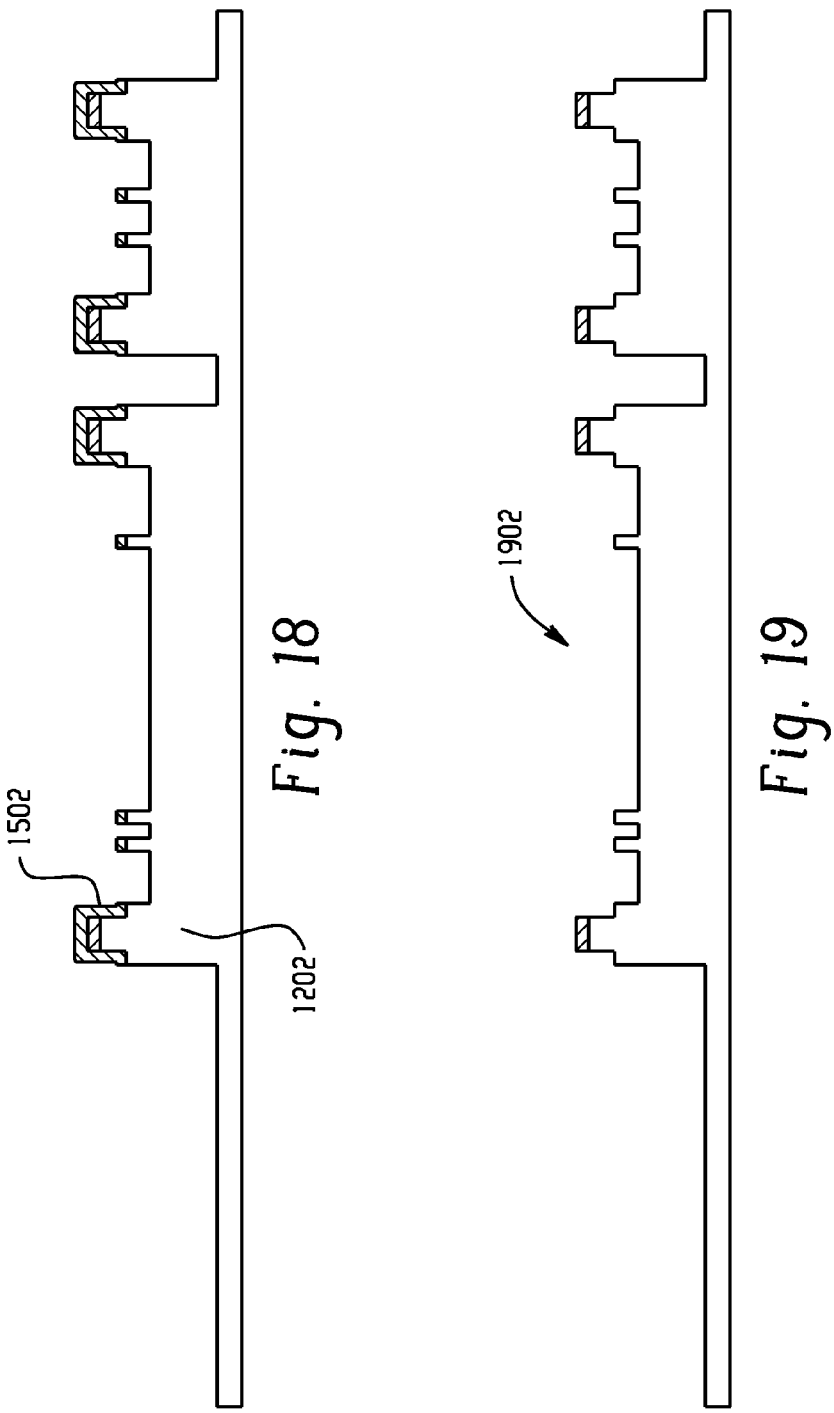

MEMS DEVICE AND METHOD OF FORMING THE SAME

FIELD

This disclosure relates generally to semiconductor processes, and, more particularly, to microelectromechanical systems (MEMS) devices and a method of forming a MEMS device.

BACKGROUND

MEMS devices are widely used and may include membrane type sensors and bulk silicon sensors. Bulk silicon sensors with a large proof-mass may provide motion sensors with high mechanical sensitivity. However, fabrication of membrane type sensors using a bulk silicon structure is difficult because the high stiffness of the bulk silicon structure does not provide sensitivity needed by membrane type sensors. Furthermore, combinations of CMOS wafers and MEMS wafers may cause an out-gassing issue that diffuses hydrogen (H2) from the PECVD oxide. The subsequent pressure level shift within the MEMS device induced by the hydrogen may degrade the performance of the devices.

SUMMARY

According to an embodiment of the invention, a method for forming a MEMS device is provided. The method includes the following operations of providing a substrate having a first portion and a second portion; fabricating a membrane type sensor on the first portion of the substrate using a double-side process; and fabricating a bulk silicon sensor on the second portion of the substrate.

According to an embodiment of the invention, a MEMS device is provided. The MEMS device includes a substrate, a membrane type sensor and a bulk silicon sensor. The substrate has a first portion and a second portion. The membrane type sensor is disposed on the first portion of the substrate and may be formed by a double-side process. The bulk silicon sensor is disposed on the second portion of the substrate.

BRIEF DESCRIPTION OF THE DRAWINGS

FIG. 3 is a sectional view illustrating removing of a portion of the getter layer for forming the MEMS device according to the embodiment of the invention.

FIG. 4 is a sectional view illustrating providing of a second dielectric layer for forming the MEMS device according to the embodiment of the invention.

FIG. 18 is a sectional view illustrating removing of a portion of the capping silicon layer for forming the MEMS device according to the embodiment of the invention.

FIG. 19 is a sectional view illustrating removing of a portion of the capping oxide layer for forming the MEMS device according to the embodiment of the invention.

DETAILED DESCRIPTION

Reference will now be made in detail to exemplary embodiments, which are illustrated in the accompanying drawings. Wherever possible, the same reference numbers will be used throughout the drawings to refer to the same or like parts.

In an exemplary embodiment of the invention, a gap of a membrane type sensor may be achieved by, for example, high etching selectivity between metal layers and dielectric layers. A CMOS wafer may be utilized for fabricating the membrane type sensor due to the thin film layer. In addition, the bulk silicon of a MEMS wafer can be utilized for fabricating bulk silicon sensors. Therefore, membrane type sensors and bulk silicon sensors may be formed on the same wafer through compatible processes.

In an exemplary embodiment of the invention, different thicknesses of the membrane of the membrane type sensor may be implemented by, for example, a simple metal wet etching technique. A metal layer may used as the sacrificial layer so that the sensing gap of membrane type sensor can be formed. The multi-sensing range of sensors may be achieved by, for example, high etching selectivity of metal wet etching technique.

In an exemplary embodiment of the invention, Titanium material may be used as the getter. The getter layer made of Titanium may reduce the charging issue which may be induced by the operation of membrane type sensor. In addition, the Titanium may absorb hydrogen gas that outgases from the dielectric layer of the CMOS wafer and maintain the cavity vacuum level at a relatively stable level for membrane type sensors and bulk silicon sensors.

In an exemplary embodiment, a MEMS device includes a membrane type sensor and a bulk silicon sensor. The membrane type sensor may be, for example, a pressure sensor, an acoustic sensor, a radio-frequency resonator, or a radio-frequency oscillator. The bulk silicon sensor may be, for example, an accelerometer, a gyroscope, a magnetic sensor, a radio-frequency resonator, and a radio-frequency oscillator.

Figure 1:
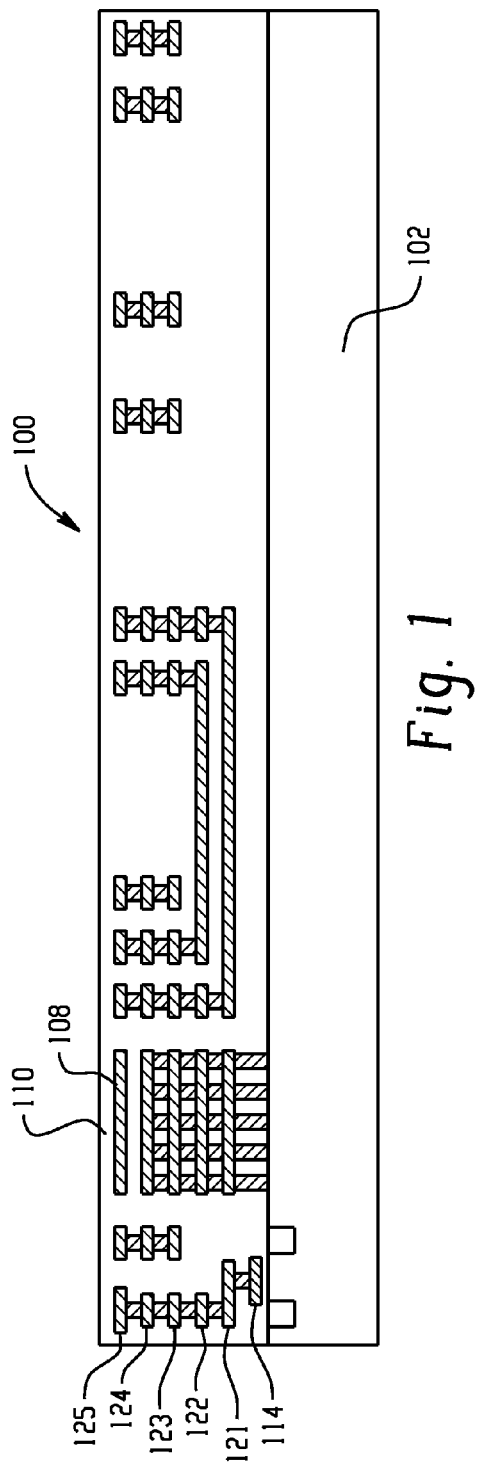
FIG. 1 is a sectional view illustrating a exemplary structure with multiple metal layers, a first dielectric layer and a poly layer for forming a MEMS device according to an embodiment of the invention.

FIG. 1 is a sectional view illustrating an exemplary structure with multiple metal layers, a first dielectric layer and a poly layer for forming a MEMS device according to an embodiment of the invention. As shown in FIG. 1, a substrate 102 may be provided for the MEMS device 100. CMOS transistors can be formed above the substrate 102. Metal layers 121-125 over the substrate 102 may be provided to cover the CMOS transistors and to provide sacrificial structure at the area of the membrane type sensor. Dielectric layers are also formed between the metal layers 121-125 to complete the structure over substrate 102. A reference element 108 may be provided by the metal layer 125 at the area of the membrane type sensor. A first dielectric layer 110 may be provided over the metal layer 125, including the reference element 108. The substrate 102 may be formed of silicon. The reference element 108 may be any conductive layer able to form a capacitance, including, but not limited to, Aluminum-Copper and Copper, for example.

In the exemplary embodiment, a semiconductor process having five metal layers 121-125 and one poly 114 may be utilized and one of the metal layers may be used as the reference element 108. Those skilled in the art upon reading this detailed description will appreciate that other numbers of metal and poly layers may be used. The thickness of the metal layers 121-125 may be, for example, about 8000 Å, 20000 Å or 40000 Å. In the illustrated exemplary embodiment, a process without a passivation layer over first dielectric layer 110 is used. However, a process with a passivation layer over first dielectric layer 110 may be used by, for example, performing a film deposition and wet etching to pattern a passivation layer over the first dielectric layer 110.

Figure 2:
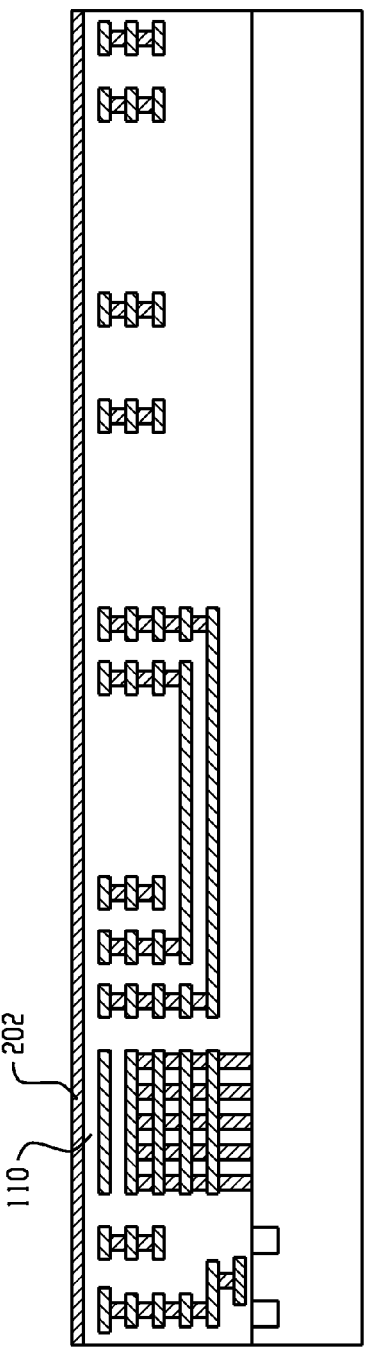
FIG. 2 is a sectional view illustrating providing of a getter layer for forming the MEMS device according to the embodiment of the invention.

FIG. 2 is a sectional view illustrating providing of a getter layer for forming the MEMS device according to the embodiment of the invention. As shown in FIG. 2, a getter layer 202 may be formed above the first dielectric layer 110. In the exemplary embodiment, the getter layer 202 may be used as a getter for the membrane type sensor and the bulk silicon sensor. Titanium may absorb hydrogen that comes from the first dielectric layer 110 formed of oxide. In the exemplary embodiment, the getter layer 202 may have a thickness of about 3000 Å to 10000 Å. Other materials like Zirconium, Aluminum, Vanadium, Iron, Cobalt, or combination thereof may also be used as a getter material to form the getter layer 202.

FIG. 3 is a sectional view illustrating removing of a portion of the getter layer for forming the MEMS device according to the embodiment of the invention. As shown in FIG. 3, a mask (not shown) may be used to define an etching region for the getter layer 202. Then, a portion of the getter layer 202 may be removed by, for example, a dry etching process.

FIG. 4 is a sectional view illustrating providing of a second dielectric layer for forming the MEMS device according to the embodiment of the invention. As shown in FIG. 4, a dielectric layer 402 may be formed over the getter layer 202 and the first dielectric layer 110 to provide a motion space for the bulk silicon sensor. In the exemplary embodiment, the second dielectric layer 402 may be formed of oxide and be the same material as the first dielectric layer 110. In the exemplary embodiment, the dielectric layer 402 may have a thickness of about 2 um to 3 um. In the exemplary embodiment, chemical mechanical polishing may be performed on the second dielectric layer 402 to prepare for a fusion bonding.

Figure 5:
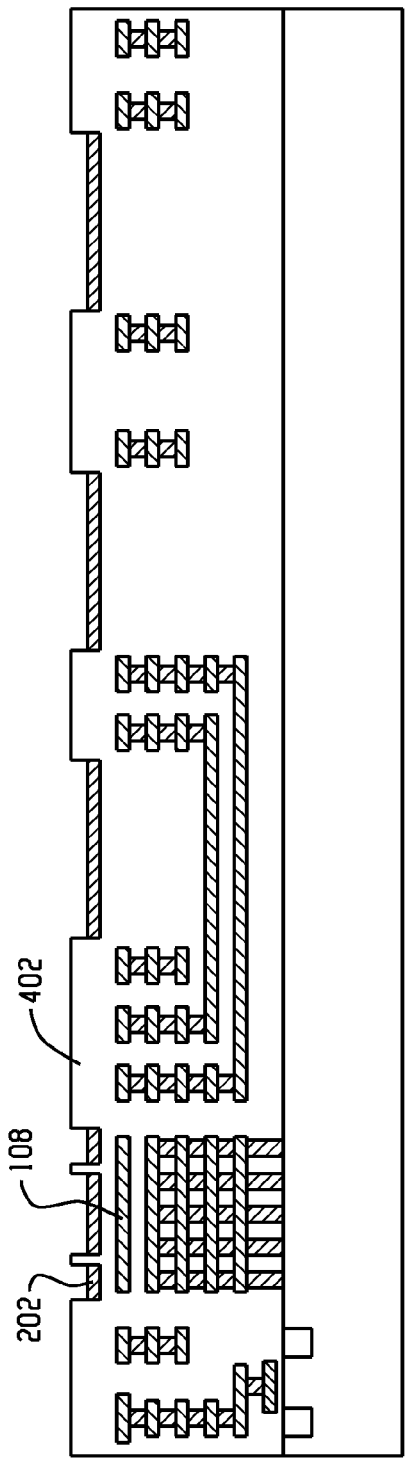
FIG. 5 is a sectional view illustrating removing of a portion of the second dielectric layer for forming the MEMS device according to the embodiment of the invention.

FIG. 5 is a sectional view illustrating removing of a portion of the second dielectric layer for forming the MEMS device according to the embodiment of the invention. As shown in FIG. 5, a mask (not shown) may be used to define an etching region for the second dielectric layer 402. Then, a portion of the second dielectric layer 402 over the reference element 108 may be removed by, for example, a dry etching process to expose a portion of the getter layer 202. The portion of getter layer 202 may be removed to improve stress balance for the membrane type sensor.

Figure 6:
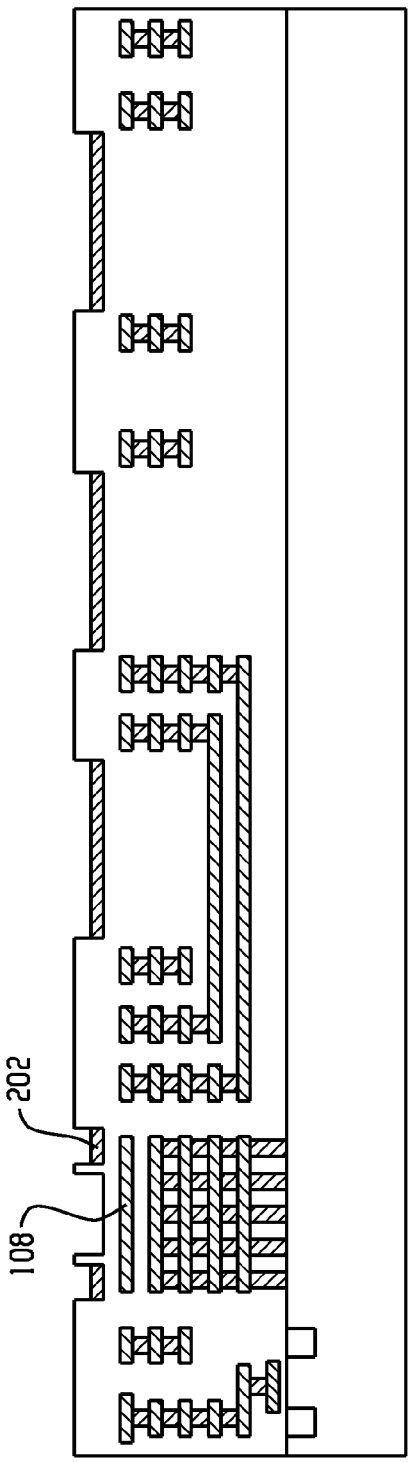
FIG. 6 is a sectional view illustrating removing of a portion of the getter layer for forming the MEMS device according to the embodiment of the invention.

FIG. 6 is a sectional view illustrating removing of a portion of the getter layer for forming the MEMS device according to the embodiment of the invention. As shown in FIG. 6, a mask (not shown) may be used to define etching region for the getter layer 202. Then, a portion of the getter layer 202 over the reference element 108 may be removed by, for example, a dry etching process to improve stress balance for the membrane type sensor.

Figure 7:
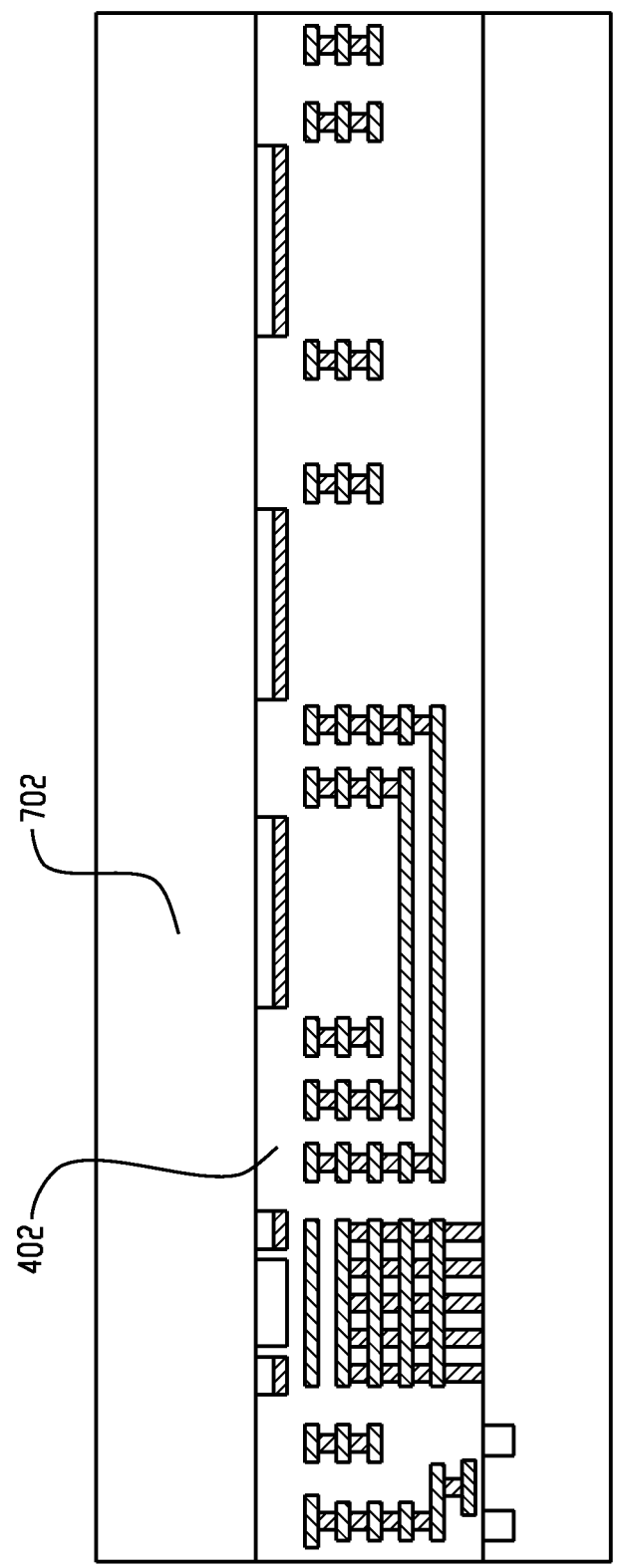
FIG. 7 is a sectional view illustrating bonding of a silicon layer to the second dielectric layer for forming the MEMS device according to the embodiment of the invention.

FIG. 7 is a sectional view illustrating bonding of a silicon layer to the second dielectric layer for forming the MEMS device according to the embodiment of the invention. As shown in FIG. 7, a silicon layer 702 may be bonded to the second dielectric layer 402 by, for example, oxide-silicon fusion bonding. In the exemplary embodiment, the silicon layer 702 may have a thickness of about 600 um to 700 um at the beginning. Then, the silicon layer 702 may be thinned down to about 20 um to 50 um.

Figure 8:
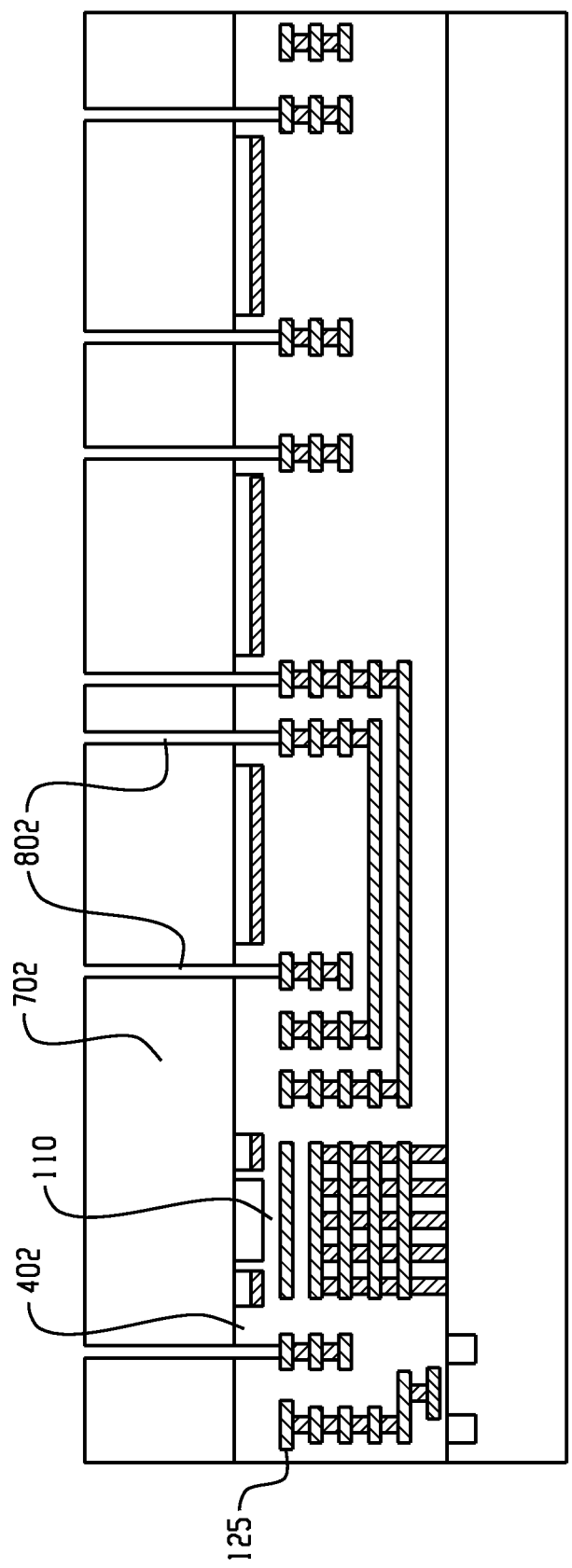
FIG. 8 is a sectional view illustrating removing of a portion of the silicon layer for forming the MEMS device according to the embodiment of the invention.

FIG. 8 is a sectional view illustrating removing of a portion of the silicon layer for forming the MEMS device according to the embodiment of the invention. As shown in FIG. 8, a mask (not shown) may be used to define an etching region for the silicon layer 702, the second dielectric layer 402, and the first dielectric layer 110. Then, a portion of the silicon layer 702, the second dielectric layer 402, and the first dielectric layer 110 may be removed by, for example, a dry etching process to expose a portion of the metal layer 125 and form holes 802. The holes 802 may extend from silicon layer 702 through the second dielectric layer 402 and the first dielectric layer 110 to the metal layer 125.

Figure 9:
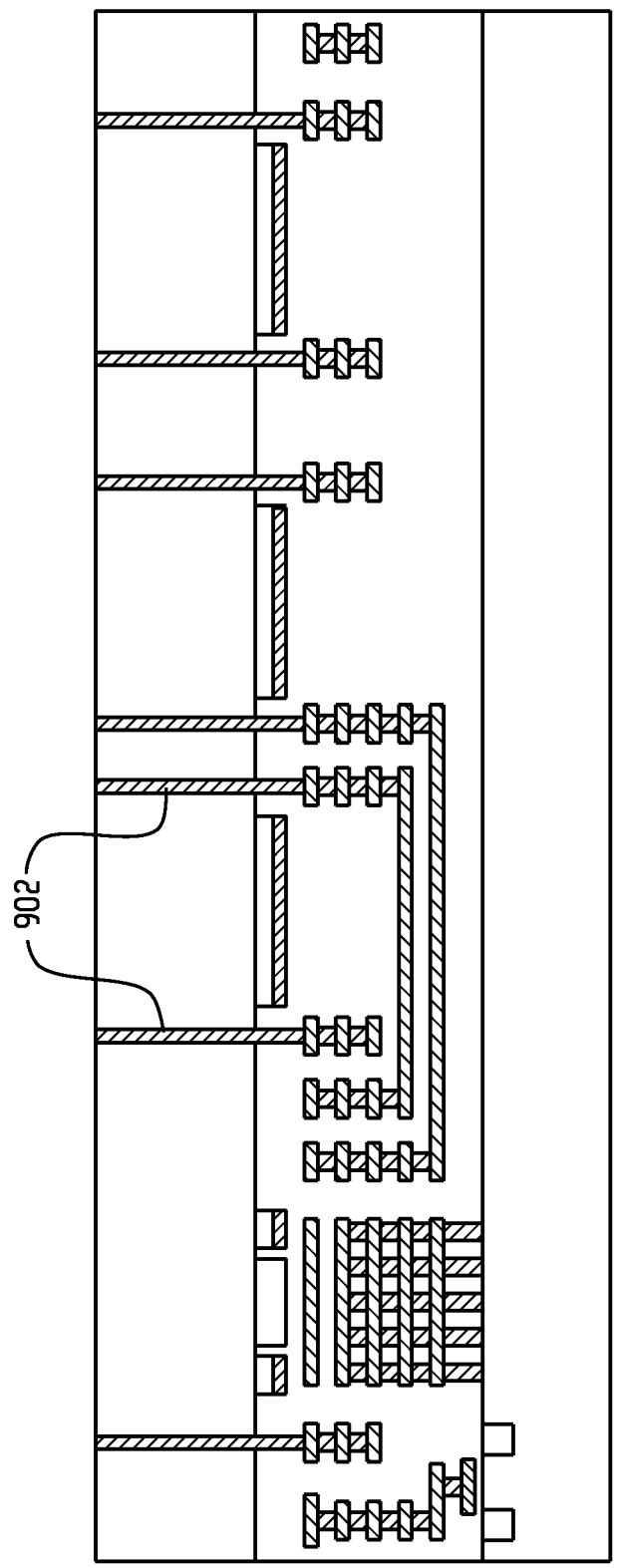
FIG. 9 is a sectional view illustrating providing of vias for forming the MEMS device according to the embodiment of the invention.

FIG. 9 is a sectional view illustrating providing of vias for forming the MEMS device according to the embodiment of the invention. As shown in FIG. 9, vias 902 may be formed to extend from silicon layer 702 through the second dielectric layer 402 and the first dielectric layer 110 to the metal layer 125 in order to have the bulk silicon sensor and the membrane type sensor electrically connectable. The vias 902 may be formed of, for example, Tungsten, Aluminum, or Copper or combination thereof.

Figure 10:
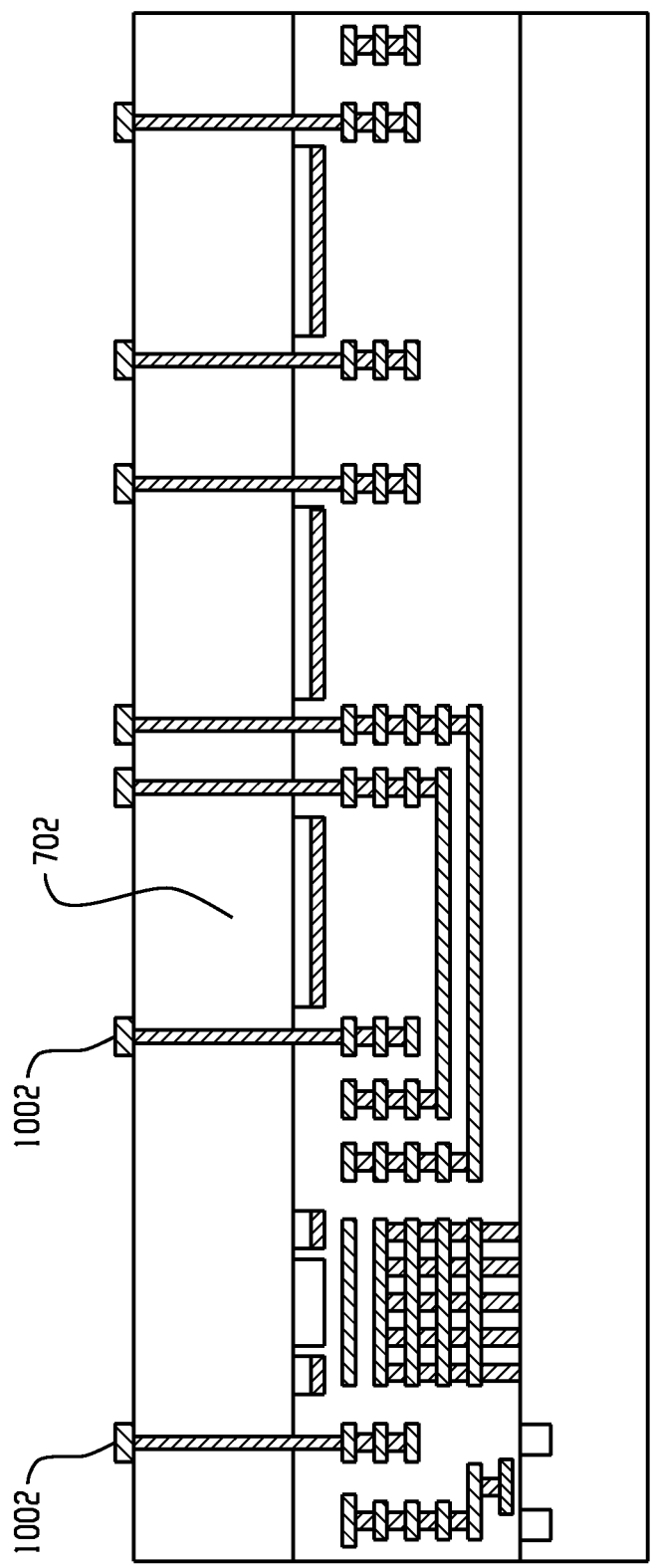
FIG. 10 is a sectional view illustrating providing of a bonding pads for forming the MEMS device according to the embodiment of the invention.

FIG. 10 is a sectional view illustrating providing of a bonding pads for forming the MEMS device according to the embodiment of the invention. As shown in FIG. 10, another metal layer is formed over the silicon layer 702 by, for example, a deposition process and then a mask for this metal layer (not shown) may be used to define a region for bonding pads 1002. Then, the bonding pads 1002 and are prepared by, for example, a dry etching process for following Eutectic bonding. The bonding pads 1002 may be any conductive layer able to form a capacitance, including, but not limited to, Aluminum, Copper or combination thereof, for example. The bonding pads 1002 may have a thickness of about 6000 Å to 10000 Å.

Figure 11:
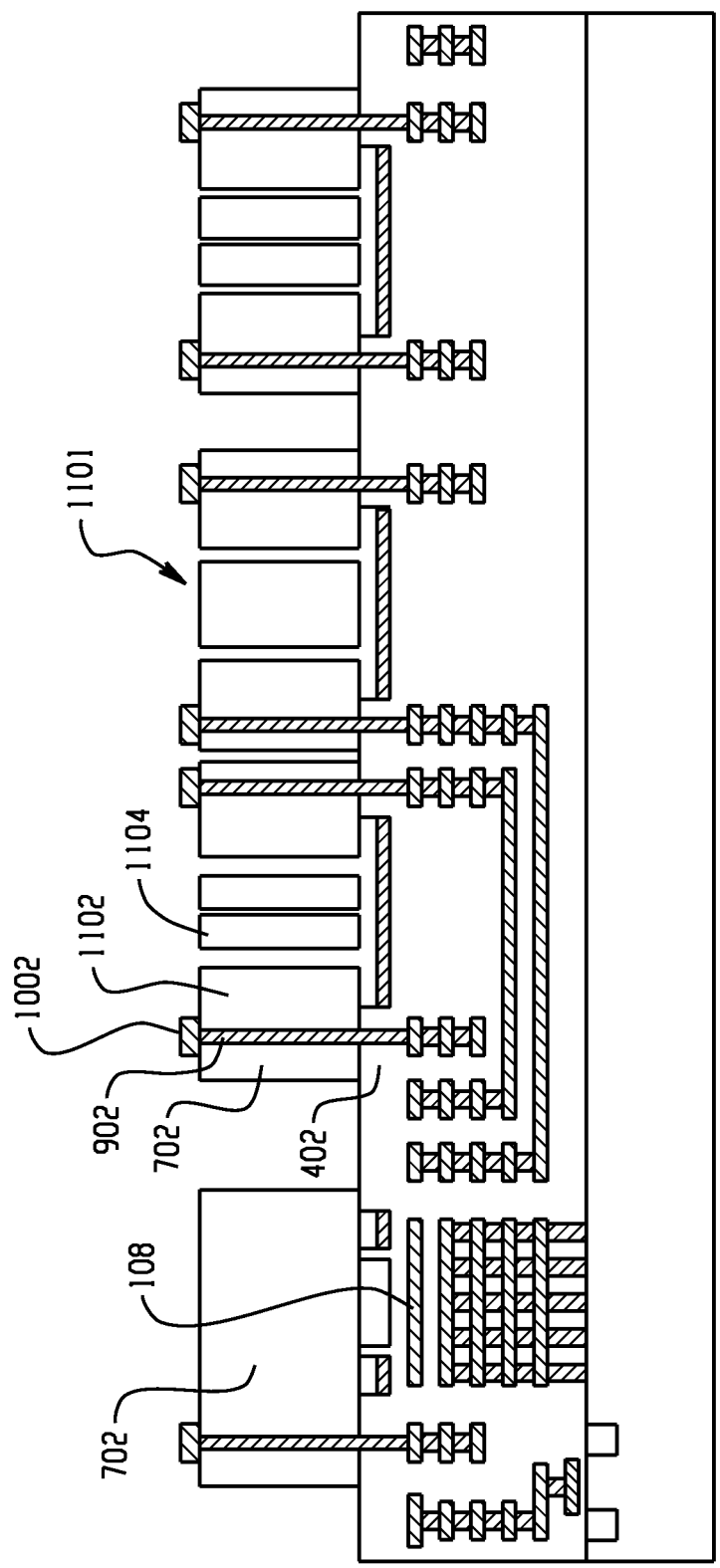
FIG. 11 is a sectional view illustrating removing of a portion of the silicon layer for forming the MEMS device according to the embodiment of the invention.

FIG. 11 is a sectional view illustrating removing of a portion of the silicon layer for forming the MEMS device according to the embodiment of the invention. As shown in FIG. 11, a mask (not shown) may be used to define etching region for silicon structures 1101 and the membrane type sensor and electrical connection. Then, a portion of the silicon layer 702 may be removed by, for example, a dry etching process. Therefore, the silicon layer 702 over the second portion of the substrate may be patterned to form the silicon structures 1101 of the bulk silicon sensor. Furthermore, the vias 902 may be provided to extend from the bonding pads 1002 through the silicon layer 702 and the second dielectric layer 402 to electrically connect the electrodes of the membrane type sensor and the electrodes of the bulk silicon sensor with the bonding pads 1102. In the exemplary embodiment, the electrodes of the membrane type may be coupled to a portion of the silicon layer 702 and to reference element 108, and the electrodes of the bulk silicon sensor may be a portion 1102, 1104 of the silicon structures 1101.

Figure 12:
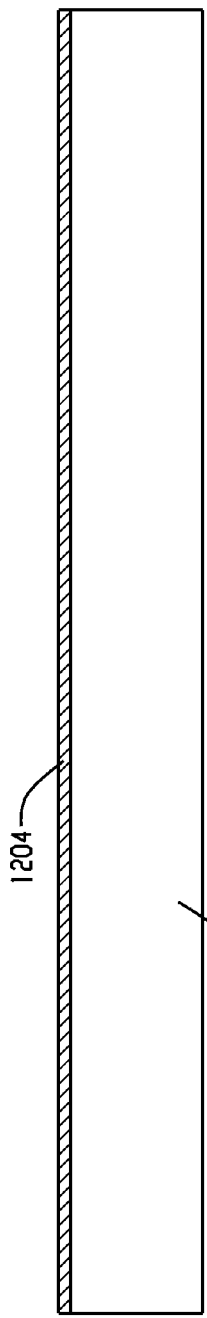
FIG. 12 is a sectional view illustrating providing of a germanium layer over a capping silicon layer for forming the MEMS device according to the embodiment of the invention.

FIG. 12 is a sectional view illustrating providing of a germanium layer over a capping silicon layer for forming the MEMS device according to the embodiment of the invention. As shown in FIG. 12, a capping silicon layer 1202 may be provided. A germanium layer 1204 may be provided over the capping silicon layer 1202. The germanium layer 1204 may have a thickness of about 3000 Å to 8000 Å.

Figure 13:
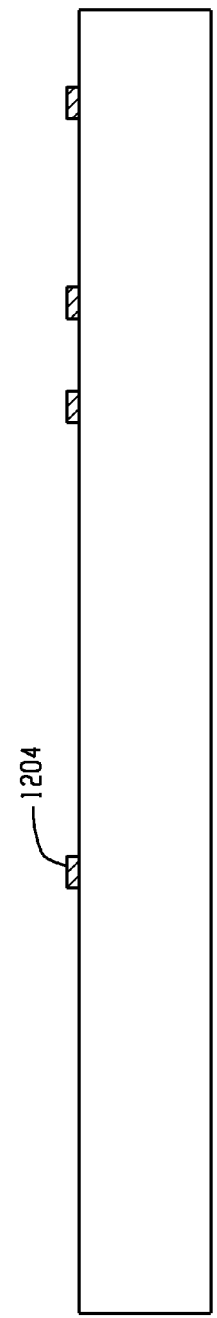
FIG. 13 is a sectional view illustrating removing of a portion of the germanium layer for forming the MEMS device according to the embodiment of the invention.

FIG. 13 is a sectional view illustrating removing of a portion of the germanium layer for forming the MEMS device according to the embodiment of the invention. As shown in FIG. 13, a mask (not shown) may be used to define an etching region for the germanium layer 1204. Then, a portion of the germanium layer 1204 may be removed by, for example, a dry etching process.

Figure 14:
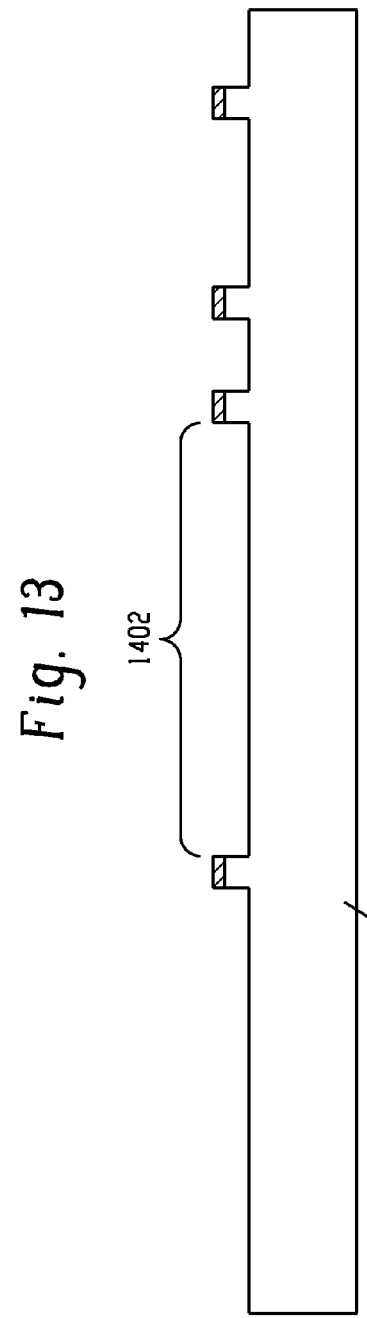
FIG. 14 is a sectional view illustrating removing of a portion of the capping silicon layer for forming the MEMS device according to the embodiment of the invention.

FIG. 14 is a sectional view illustrating removing of a portion of the capping silicon layer for forming the MEMS device according to the embodiment of the invention. As shown in FIG. 14, a mask (not shown) may be used to define an etching region for the capping silicon layer 1202. Then, a portion of the capping silicon layer 1202 may be removed for about 3 um to 10 um by, for example, a dry etching process to define a first cavity 1402 of the bulk silicon sensor.

Figure 15:
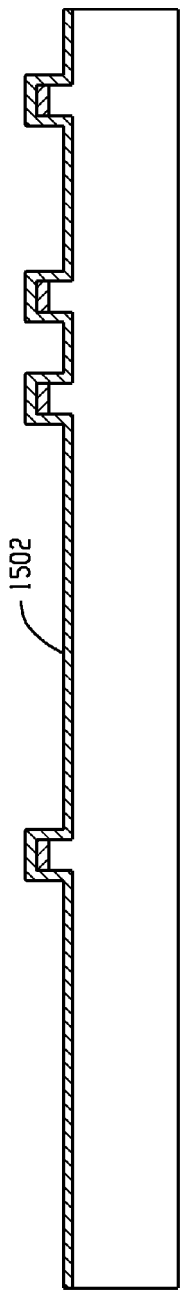
FIG. 15 is a sectional view illustrating providing of a capping oxide layer for forming the MEMS device according to the embodiment of the invention.

FIG. 15 is a sectional view illustrating providing of a capping oxide layer for forming the MEMS device according to the embodiment of the invention. As shown in FIG. 15, a capping oxide layer 1502 may be formed for about 10000 Å to 20000 Å by oxide deposition as a hard mask for the cavity of the bulk silicon sensor.

Figure 16:
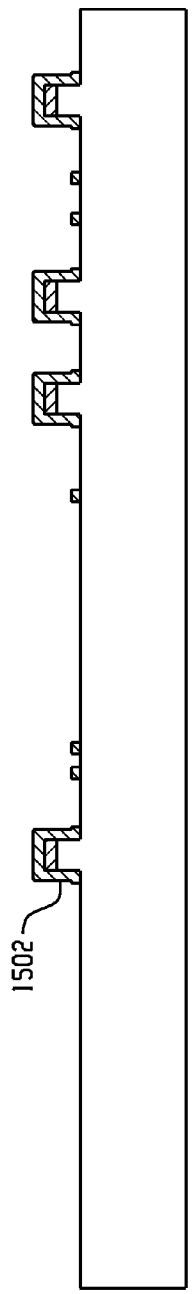
FIG. 16 is a sectional view illustrating opening of a portion of the capping oxide layer for forming the MEMS device according to the embodiment of the invention.

FIG. 16 is a sectional view illustrating opening of a portion of the capping oxide layer for forming the MEMS device according to the embodiment of the invention. As shown in FIG. 16, a mask (not shown) may be used to define a region for deep silicon trench in the grind-to-open process. Then, a portion of the capping oxide layer 1502 may be removed for about 10000 Å to 20000 Å by, for example, a dry etching process.

Figure 17:
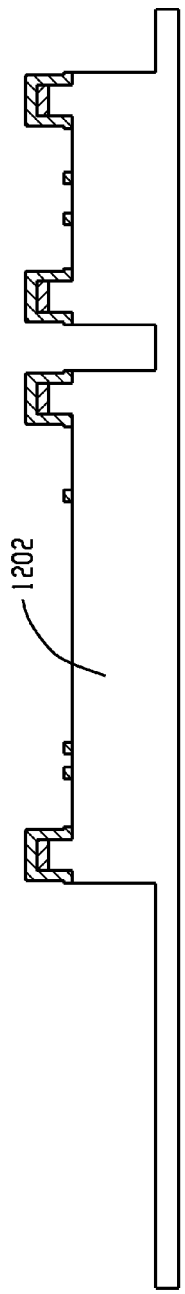
FIG. 17 is a sectional view illustrating removing of a portion of the capping silicon layer for forming the MEMS device according to the embodiment of the invention.

FIG. 17 is a sectional view illustrating removing of a portion of the capping silicon layer for forming the MEMS device according to the embodiment of the invention. As shown in FIG. 17, a mask (not shown) may be used to define a region for deep silicon trench in the grind-to-open process. Then, a portion of the capping silicon layer 1202 may be removed for about 100 um to 140 um by, for example, a dry etching process.

FIG. 18 is a sectional view illustrating removing of a portion of the capping silicon layer for forming the MEMS device according to the embodiment of the invention. As shown in FIG. 18, the capping oxide layer 1502 may be used as a hard mask. Then, a portion of the capping silicon layer 1202 may be removed for about 30 um to 60 um by, for example, a dry etching process.

FIG. 19 is a sectional view illustrating removing of a portion of the capping oxide layer for forming the MEMS device according to the embodiment of the invention. As shown in FIG. 19, the capping oxide layer 1502 may be removed for about 10000 Å to 20000 Å by, for example, a wet etching process. A capping structure 1902 may be provided.

Figure 20:
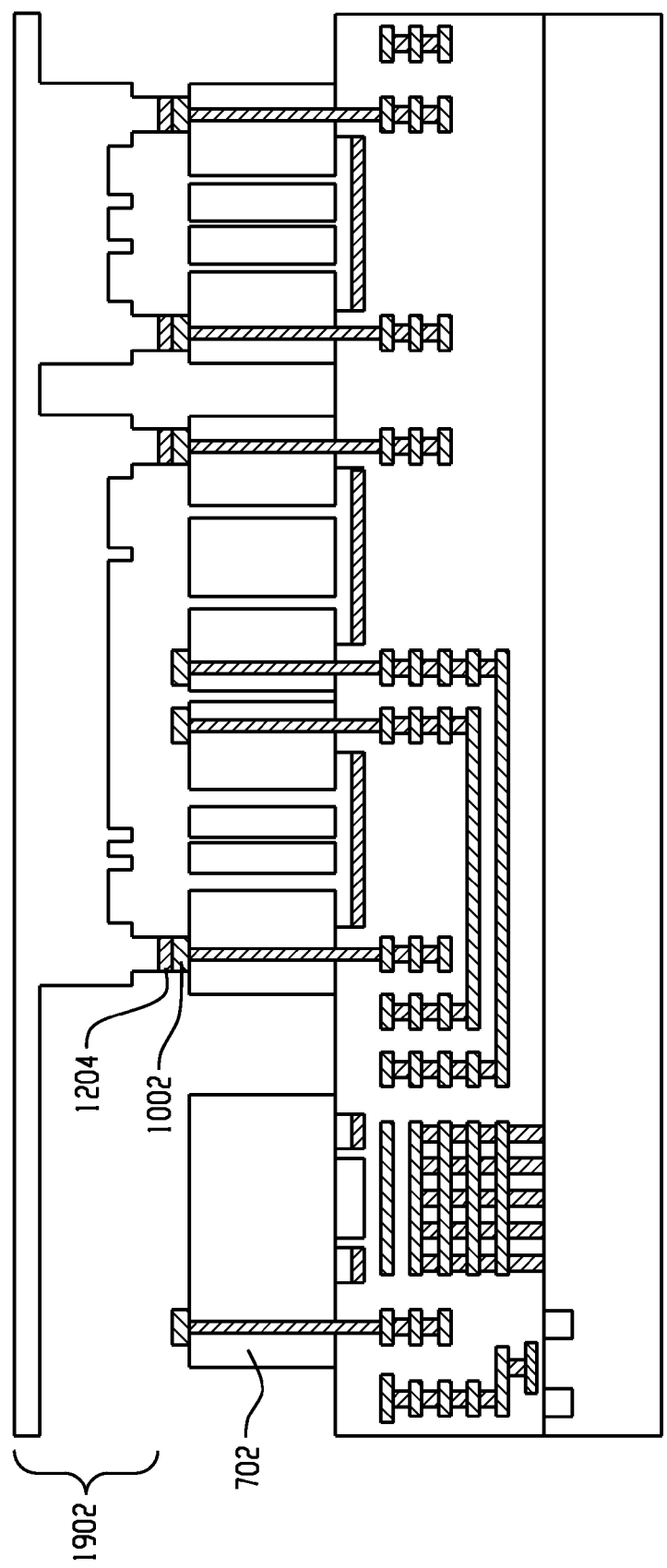
FIG. 20 is a sectional view illustrating bonding of the germanium layer to the bonding pads for forming the MEMS device according to the embodiment of the invention.

FIG. 20 is a sectional view illustrating bonding of the germanium layer to the bonding pads for forming the MEMS device according to the embodiment of the invention. As shown in FIG. 20, the capping structure 1902 may be bonded to the silicon layer 702 by Eutectic bonding. To be more specific, the germanium layer 1204 of the capping structure 1902 may be bonded to the bonding pads 1002 over the silicon layer 702. In the exemplary embodiment, the bonding pads 1002 may be formed of Aluminum (with few percentage of Copper) and then a Aluminum-Germanium eutectic bonding may be performed.

Figure 21:
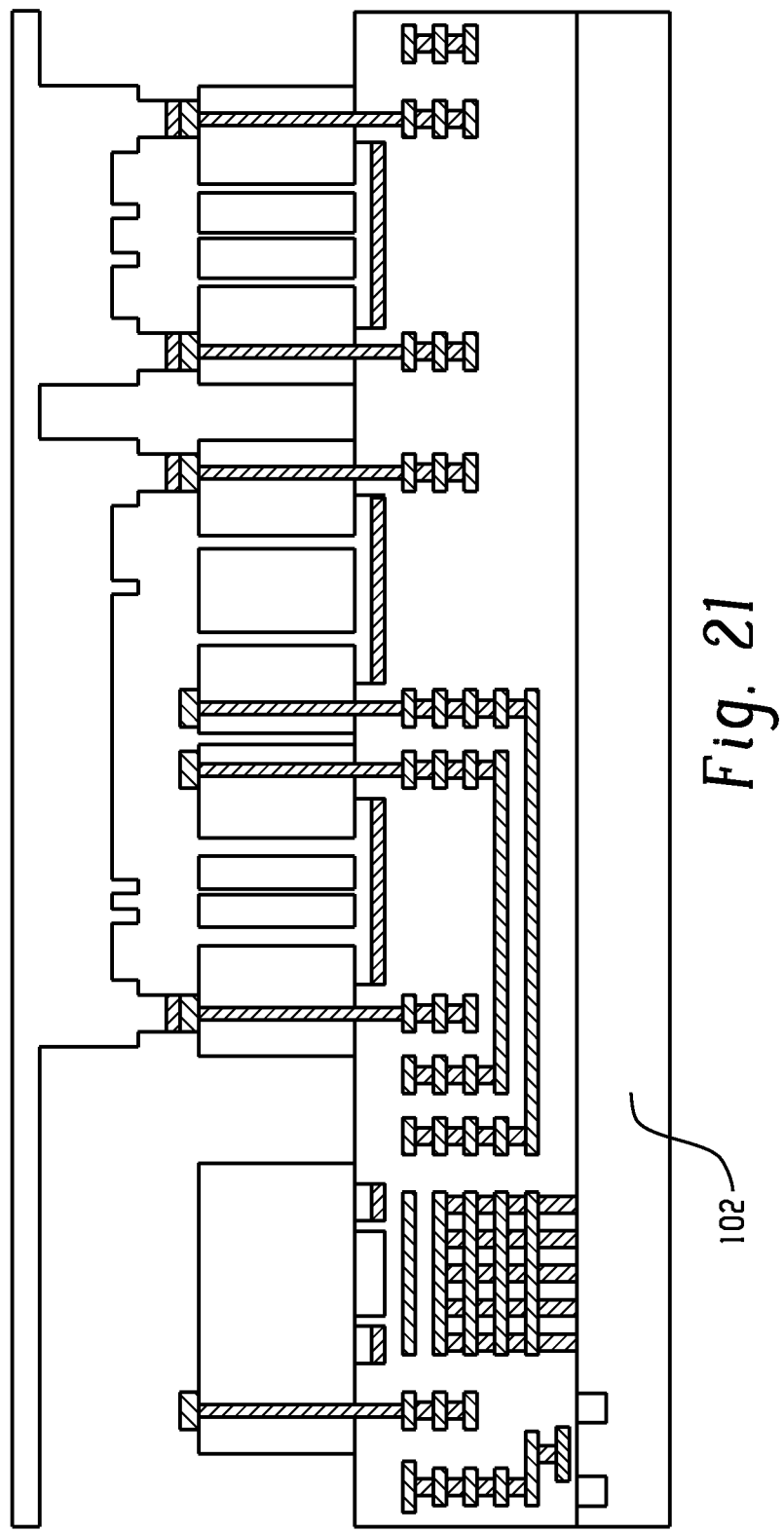
FIG. 21 is a sectional view illustrating performing a backside thin down process on the substrate for forming the MEMS device according to the embodiment of the invention.

FIG. 21 is a sectional view illustrating performing a back-side thin down process on the substrate for forming the MEMS device according to the embodiment of the invention. As shown in FIG. 21, a back-side thin down process may be performed on the substrate 102 to reduce the thickness of the substrate 102.

Figure 22:
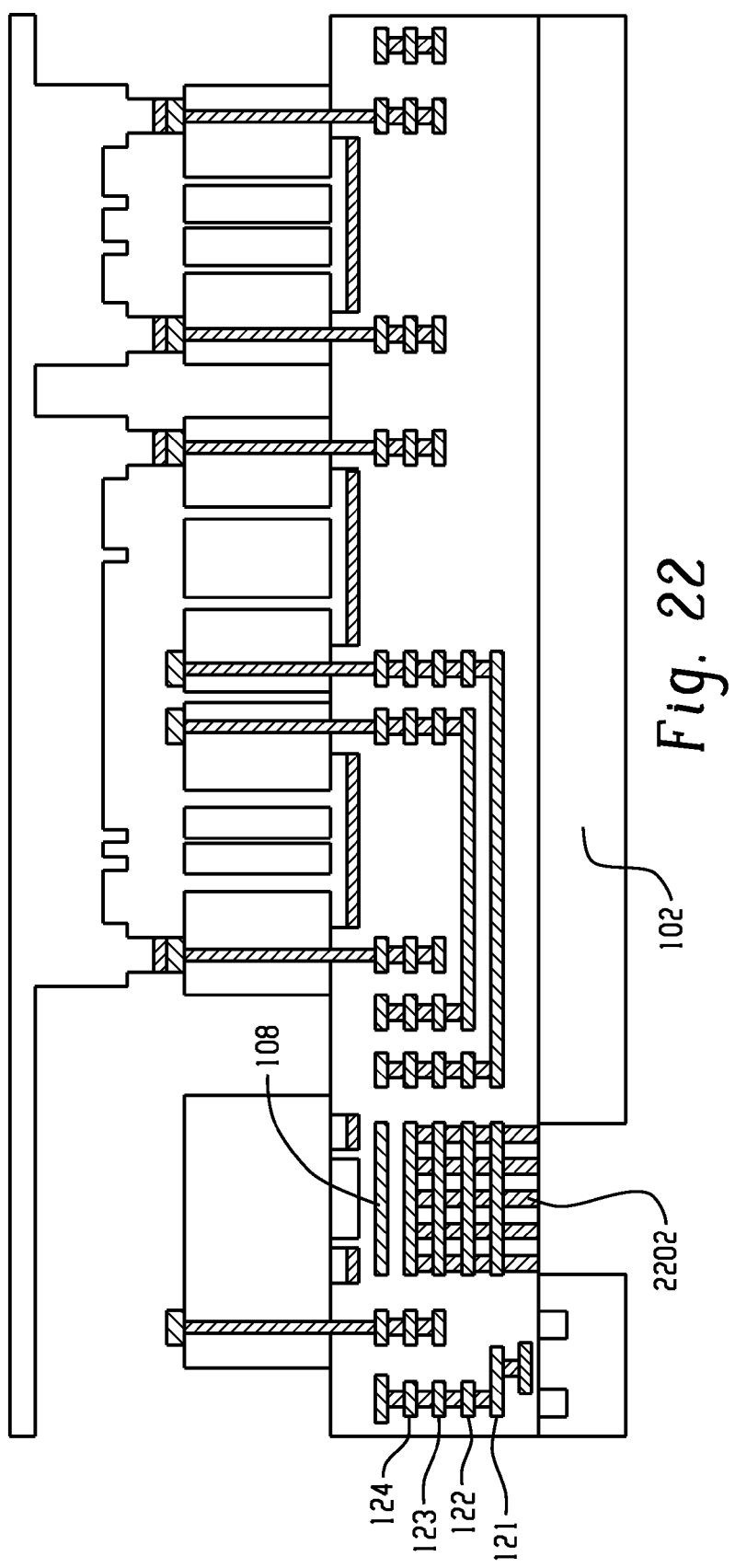
FIG. 22 is a sectional view illustrating removing of a portion of the substrate for forming the MEMS device according to the embodiment of the invention.

FIG. 22 is a sectional view illustrating removing of a portion of the substrate for forming the MEMS device according to the embodiment of the invention. As shown in FIG. 22, a mask (not shown) may be used to define an etching region for the substrate 102. Then, a portion of the substrate 102 under the reference element 108 may be removed by, for example, a deep silicon dry etching process to expose a portion of the metal layers 121-124 and the vias 2202 under the reference element 108. In the exemplary embodiment, the vias 2202 may be formed of Tungsten.

Figure 23:
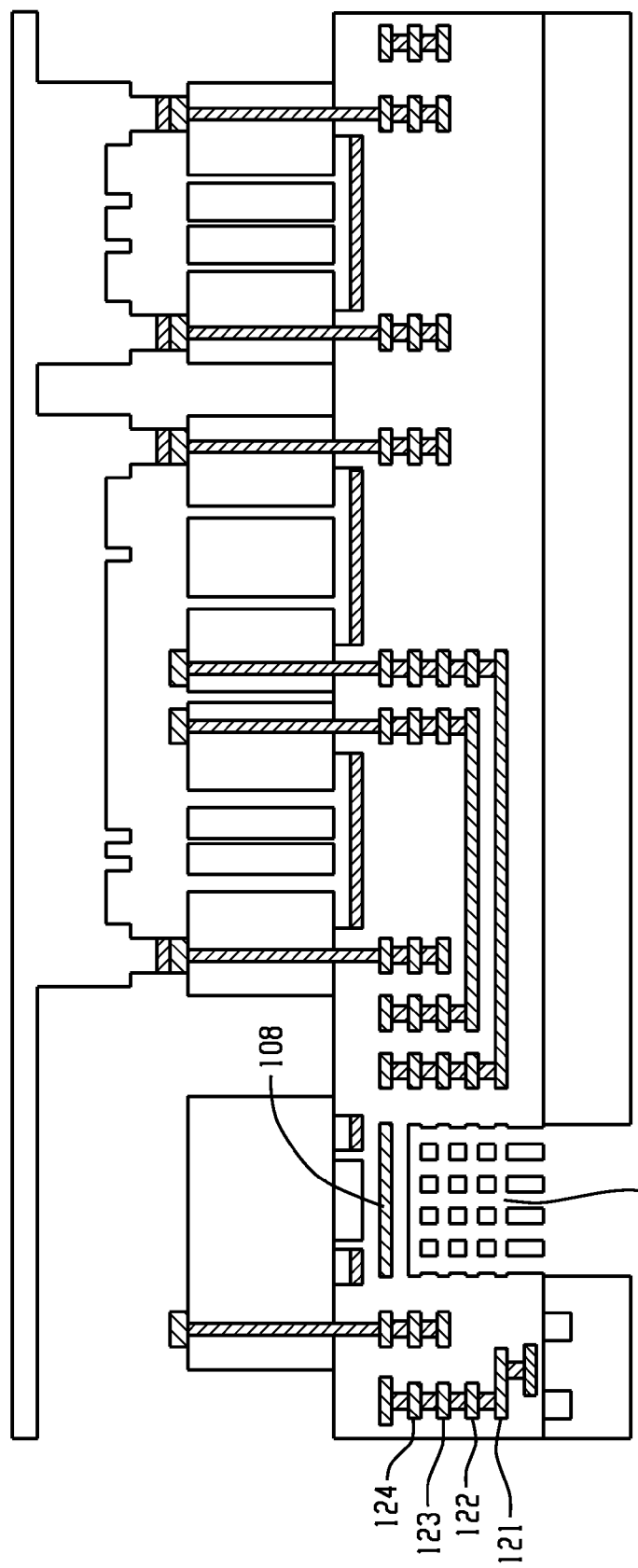
FIG. 23 is a sectional view illustrating removing of metal layers for forming the MEMS device according to the embodiment of the invention.

FIG. 23 is a sectional view illustrating removing of metal layers for forming the MEMS device according to the embodiment of the invention. As shown in FIGS. 22-23, the portion of the vias 2202 under the reference element 108 may be removed. Then, a portion of the metal layers 121-124 under the reference element 108 may be removed to form a back cavity 2302. In the exemplary embodiment, removing a portion of the metal layers 121-124 may be performed by isotropic etching.

In the exemplary embodiment, a portion of the Tungsten via and a portion of the metal layers 121-124 may be removed by wet etching. In the exemplary, the extent of removal of the portion of the metal layers 121-124 may be varied to provide a pressure sensor, which is one type of membrane type sensor, of varying sensitivities and characteristics, For example, the pressure sensor may be formed with varying thickness, gap and sensitivity.

Figure 24:
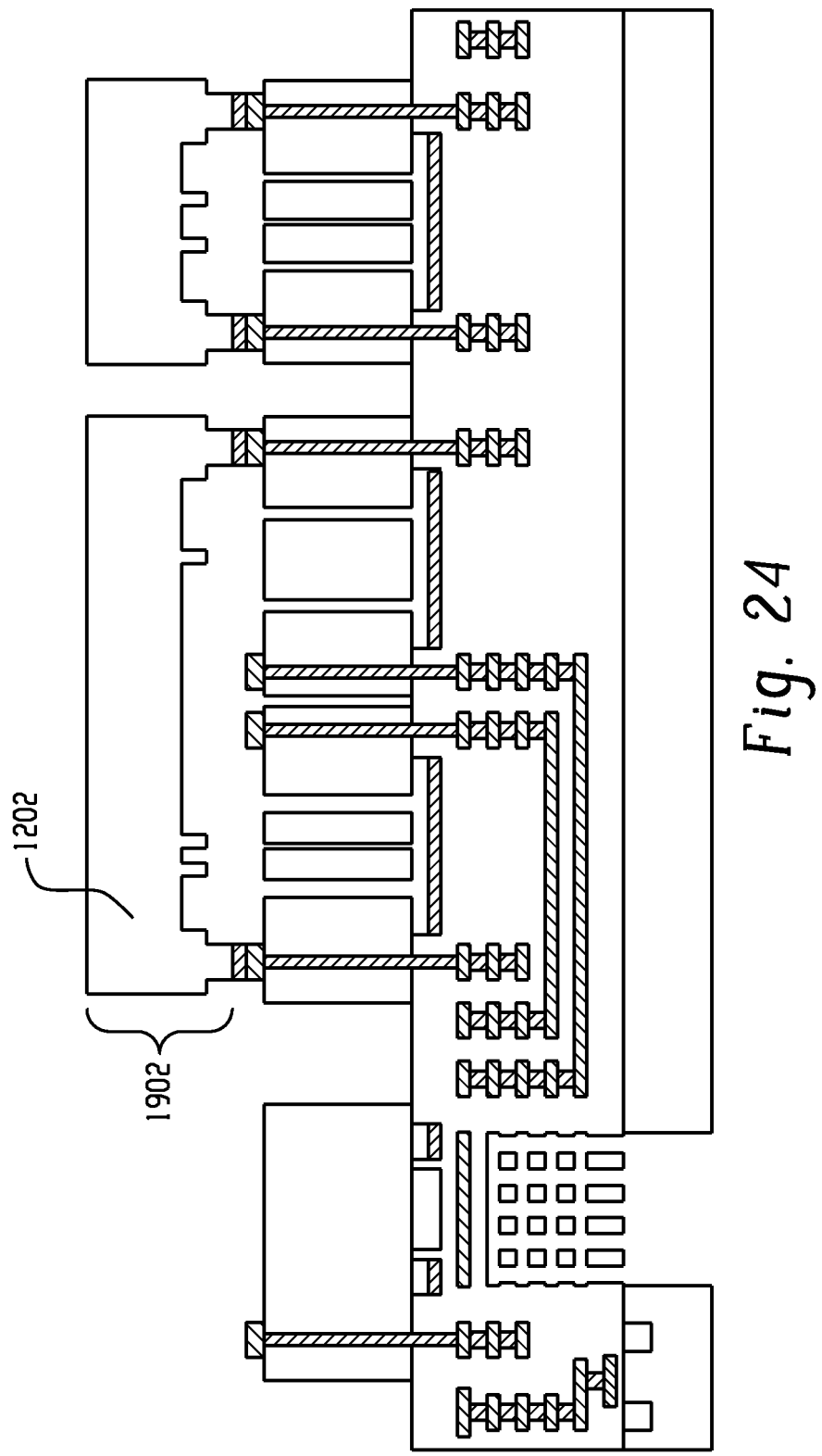
FIG. 24 is a sectional view illustrating performing a grind-to-open process on the capping silicon layer for forming the MEMS device according to the embodiment of the invention.

FIG. 24 is a sectional view illustrating performing a grind-to-open process on the capping silicon layer for forming the MEMS device according to the embodiment of the invention. As shown in FIG. 24, a grind-to-open (GTO) process may be performed on the capping silicon layer 1202 of the capping structure 1902 to make the membrane type sensor and the bulk silicon sensor apart.

Figure 25:
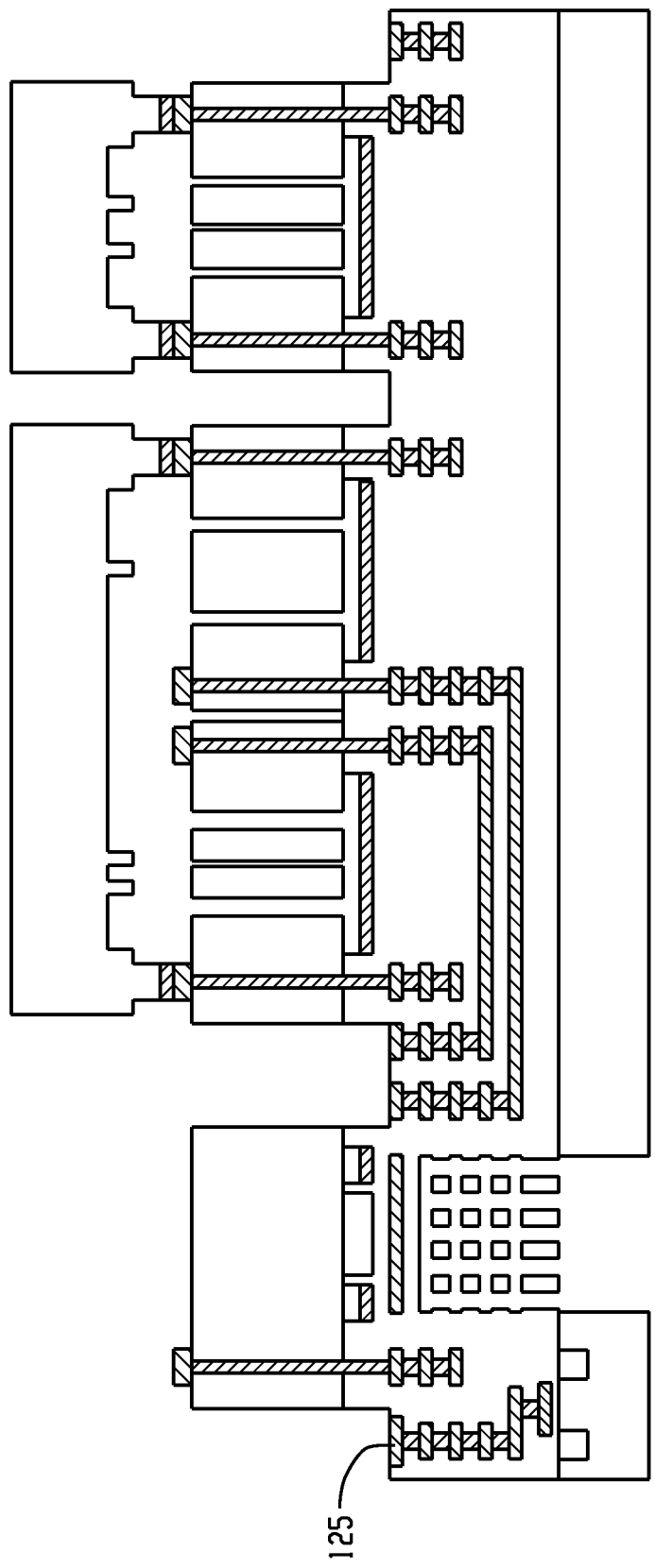
FIG. 25 is a sectional view illustrating removing of a portion of the dielectric layers for forming the MEMS device according to the embodiment of the invention.

FIG. 25 is a sectional view illustrating removing of a portion of the dielectric layers for forming the MEMS device according to the embodiment of the invention. As shown in FIG. 25, the dielectric layers 110, 402 over a portion of metal layer 125 may be removed by wafer-level etching back process so that the portion of metal layer 125 may be exposed for electrical connection.

Figure 26:
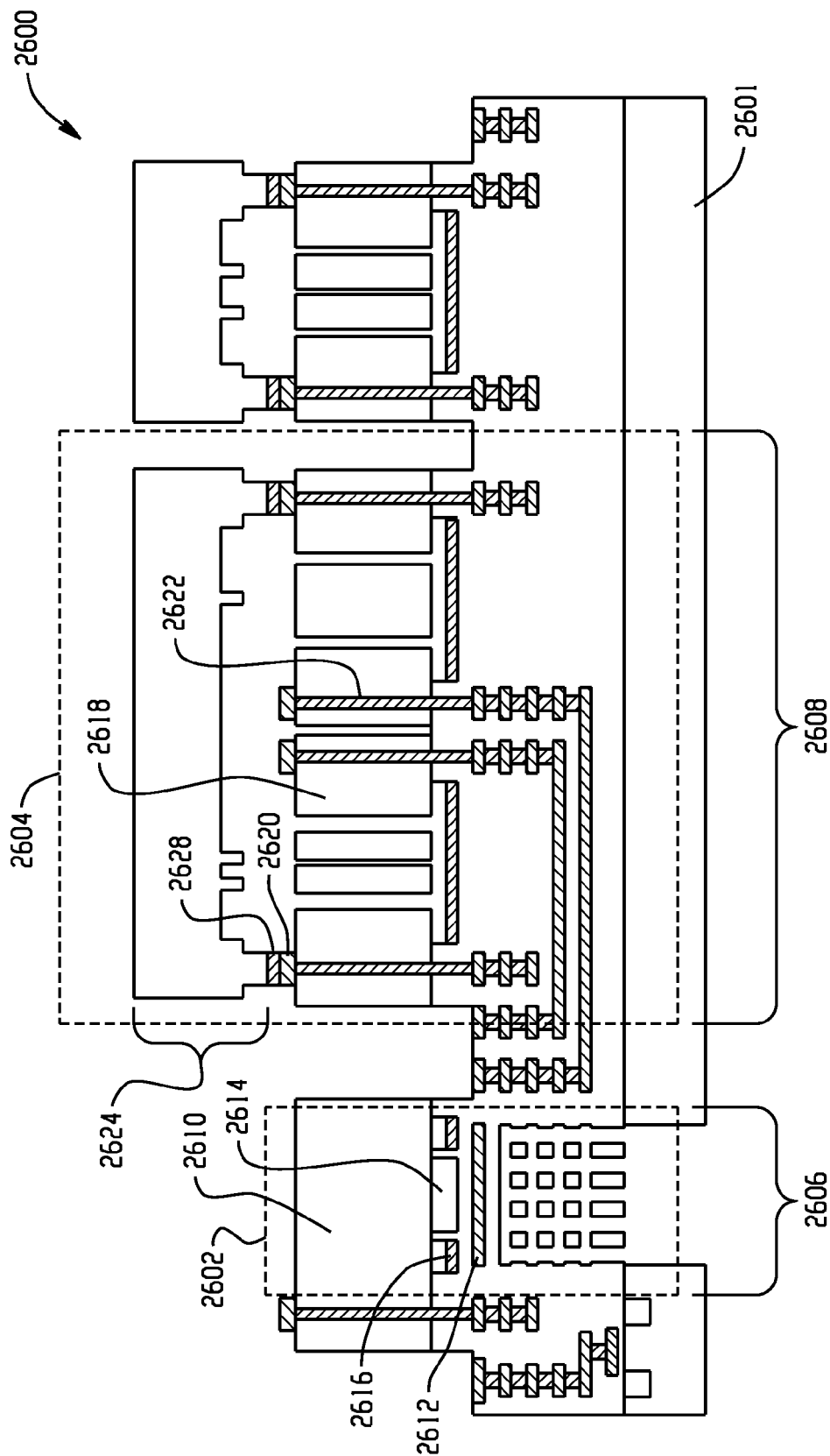
FIG. 26 is a sectional view illustrating a MEMS device according to an embodiment of the invention.

FIG. 26 is a sectional view illustrating a MEMS device according to an embodiment of the invention. As shown in FIG. 26, a MEMS device 2600 may be provided in the exemplary embodiment of the invention. A substrate 2601 may have a first portion 2606 and a second portion 2608. A membrane type sensor 2602 may be disposed on the first portion 2606 of the substrate 2601 and may be formed by a double-side process. The double-side process refers to a process including general top-down manufacturing process and a back-side manufacturing process for etching the substrate. A bulk silicon sensor 2604 may be disposed on the second portion 2608 of the substrate 2601. The membrane type sensor 2602 may include a silicon layer 2610, a reference element 2612, a sealed cavity 2614 and a getter layer 2616. The silicon layer 2610 and the reference element 2612 may serve as electrodes of the membrane type sensor 2602. The sealed cavity 2614 may be disposed between the silicon layer 2610 and the reference element 2612, and the sealed cavity 2614 is sealed by the silicon layer 2610. In the exemplary embodiment, the getter layer 2616 may be used as a getter for the membrane type sensor 2602 and the bulk silicon sensor 2604.

In the exemplary embodiment, the bulk silicon sensor 2604 may include silicon structures 2618 configured as electrodes disposed above the getter layer 2616 at the second portion 2608 of the substrate 2601.

In the exemplary embodiment, the MEMS device 2600 may further include bonding pads 2620 and vias 2622. The bonding pads 2620 may be disposed above the silicon structures 2618. The vias 2622 may extend from the bonding pads 2620 and through the silicon structures 2618 to electrically connect electrodes of the membrane type sensor 2602 and the bulk silicon sensor 2604 to the bonding pads 2620.

In the exemplary embodiment, the MEMS device 2600 may further include a capping structure 2624. The capping structure 2624 may be disposed above the bonding pads 2620.

In the exemplary embodiment, the capping structure 2624 may include a capping silicon layer 2626 and a germanium layer 2628. The germanium layer 2628 may be disposed between the capping silicon layer 2626 and the bonding pads 2620.

In the exemplary embodiment, the MEMS device 2600 may further includes a metal layer (not shown) disposed under the reference element 2612. The metal layer (not shown) may be configured to be removed to make a pressure of the sealed cavity 2614 influenced by external air pressure. The metal layer (not shown) may be configured to adjust a sensitivity of the membrane type sensor 2602.

In the exemplary embodiment, the getter layer 2616 is disposed between the silicon layer 2610 and the reference element 2612. A portion of the substrate 2601 is configured to be removed. The reference element 2612 is made of metal material.

In an exemplary embodiment, a mobile device is provided. The mobile device may includes the MEMS device aforementioned and described in FIG. 26. The MEMS device may include a substrate, a membrane type sensor and a bulk silicon sensor. The substrate may have a first portion and a second portion. The membrane type sensor may be disposed on the first portion of the substrate and may be formed by a double-side process. The bulk silicon sensor may be disposed on the second portion of the substrate.

Figure 27:
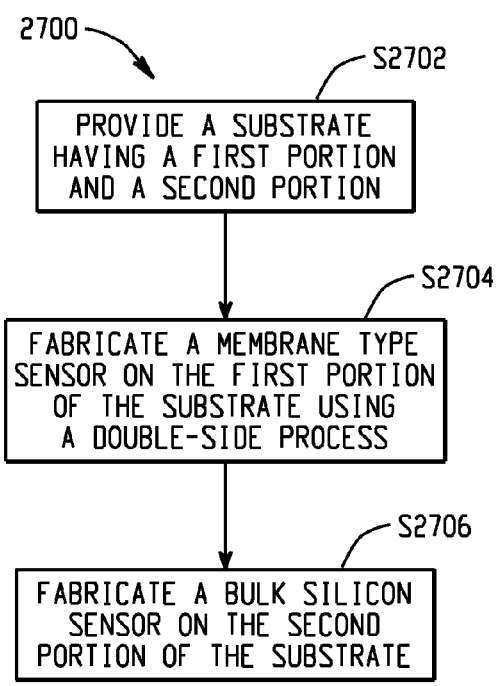
FIG. 27 is a flow chart for forming a MEMS device according to an exemplary embodiment of the invention.

FIG. 27 is a flow chart for forming a MEMS device according to an exemplary embodiment of the invention. As shown in FIG. 27, the method 2700 for forming a MEMS device is provided. The method 2700 may include the following procedures: providing a substrate having a first portion and a second portion (S2702); fabricating a membrane type sensor on the first portion of the substrate using a double-side process (S2704); and fabricating a bulk silicon sensor on the second portion of the substrate (S2706).

Figure 28:
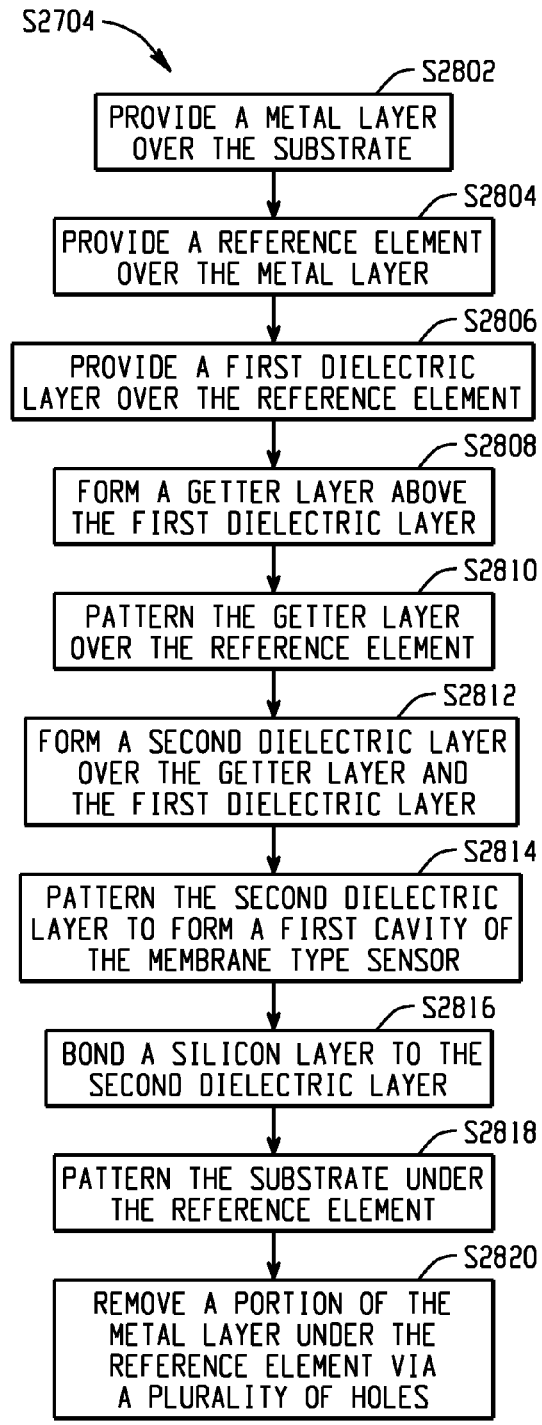
FIG. 28 is a flow chart for the operation of fabricating the membrane type sensor according to an exemplary embodiment of the invention.

FIG. 28 is a flow chart for the operation of fabricating the membrane type sensor according to an exemplary embodiment of the invention. As shown in FIG. 28, the operation S2704 for fabricating a membrane type sensor on the first portion of the substrate using a double-side process is provided. The operation S2704 may include the following procedures: providing a metal layer over the substrate (S2802); providing a reference element over the metal layer (S2804); providing a first dielectric layer over the reference element (S2806); forming a getter layer above the first dielectric layer (S2808); patterning the getter layer over the reference element (S2810); forming a second dielectric layer over the getter layer and the first dielectric layer (S2812); patterning the second dielectric layer to form a first cavity of the membrane type sensor (S2814); bonding a silicon layer to the second dielectric layer (S2816); patterning the substrate under the reference element (S2818); and removing a portion of the metal layer under the reference element via a plurality of holes (S2820).

Figure 29:
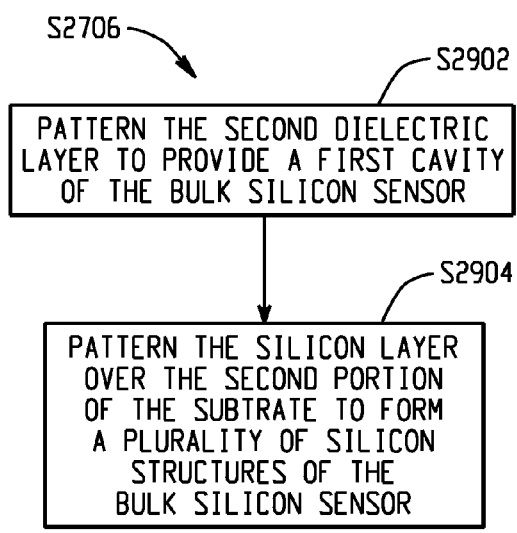
FIG. 29 is a flow chart for the operation of fabricating the bulk silicon sensor according to an exemplary embodiment of the invention.

FIG. 29 is a flow chart for the operation of fabricating the bulk silicon sensor according to an exemplary embodiment of the invention. As shown in FIG. 29, the operation S2706 for fabricating the bulk silicon sensor is provided. The operation S2706 may include the following procedures: patterning the second dielectric layer to provide a first cavity of the bulk silicon sensor (S2902); and patterning the silicon layer over the second portion of the substrate to form a plurality of silicon structures of the bulk silicon sensor (S2904).

In the exemplary embodiment, the operation of patterning the getter layer further includes patterning the getter layer for the membrane type sensor and the bulk silicon sensor. In the exemplary embodiment, the operation of patterning the getter layer further includes patterning a Titanium layer. In the exemplary embodiment, the operation of providing the first dielectric layer over the reference element further includes patterning an oxide layer. In the exemplary embodiment, the operation of patterning the second dielectric layer to form the first cavity of the membrane type sensor further includes patterning an oxide layer. In the exemplary embodiment, the operation of providing the reference element over the metal layer further includes providing the reference element made of metal material. In the exemplary embodiment, the operation of providing the reference element over the metal layer further includes providing the reference element as an electrode of the membrane type sensor.

This written description uses examples to disclose the disclosure, include the best mode, and also to enable a person skilled in the art to make and use the disclosure. The patentable scope of the disclosure may include other examples that occur to those skilled in the art.

One skilled in the relevant art will recognize that the various embodiments may be practiced without one or more of the specific details, or with other replacement and/or additional methods, materials, or components. Well-known structures, materials, or operations may not be shown or described in detail to avoid obscuring aspects of various embodiments of the disclosure. Various embodiments shown in the figures are illustrative example representations and are not necessarily drawn to scale. Particular features, structures, materials, or characteristics may be combined in any suitable manner in one or more embodiments. Various additional layers and/or structures may be included and/or described features may be omitted in other embodiments. Various operations may be described as multiple discrete operations in turn, in a manner that is most helpful in understanding the disclosure. However, the order of description should not be construed as to imply that these operations are necessarily order dependent. In particular, these operations need not be performed in the order of presentation. Operations described herein may be performed in a different order, in series or in parallel, than the described embodiment. Various additional operations may be performed and/or described. Operations may be omitted in additional embodiments.

This written description and the following claims may include terms, such as left, right, top, bottom, over, under, upper, lower, first, second, etc. that are used for descriptive purposes only and are not to be construed as limiting. For example, terms designating relative vertical position may refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and may still fall within the meaning of the term "top." The term "on" as used herein (including in the claims) may not indicate that a first layer "on" a second layer is directly on and in immediate contact with the second layer unless such is specifically stated; there may be a third layer or other structure between the first layer and the second layer on the first layer. The embodiments of a device or article described herein may be manufactured, used, or shipped in a number of positions and orientations. Persons skilled in the art will recognize various equivalent combinations and substitutions for various components shown in the figures.

What is claimed is:

1. A microelectromechanical system (MEMS) device, comprising:
   a substrate having a first portion and a second portion;
   a membrane type sensor disposed on the first portion of the substrate and formed by a double-side process; and
   a bulk silicon sensor disposed on the second portion of the substrate, wherein the membrane type sensor further comprises:
   a silicon layer;
   a reference element configured as an electrode of the membrane type sensor; and
   a substantially sealed cavity disposed between the silicon layer and the reference element.

2. The device of claim 1, wherein the sealed cavity is sealed by the silicon layer.

3. The device of claim 1, wherein a portion of the substrate is configured to be removed.

4. The device of claim 1, wherein the reference element is made of metal material.

5. The device of claim 1, further comprising a metal layer disposed under the reference element.

6. The device of claim 5, wherein the metal layer is configured to be removed to make a pressure of the sealed cavity influenced by external air pressure.

7. The device of claim 5, wherein the metal layer is configured to adjust a sensitivity of the membrane type sensor.

8. The device of claim 1, further comprising a getter layer for the membrane type sensor and the bulk silicon sensor.

9. The device of claim 8, wherein the getter layer comprises Titanium.

10. The device of claim 8, wherein the getter layer is disposed between the silicon layer and the reference element.

11. A method for forming a microelectromechanical systems (MEMS) device, comprising:
    providing a substrate having a first portion and a second portion;
    fabricating a membrane type sensor on the first portion of the substrate using a double-side process; and
    fabricating a bulk silicon sensor on the second portion of the substrate, wherein fabricating the membrane type sensor on the first portion of the substrate using a double-side process further comprises:
    providing a metal layer over the substrate;
    providing a reference element over the metal layer;
    providing a first dielectric layer over the reference element;
    forming a getter layer above the first dielectric layer;
    patterning the getter layer over the reference element;
    forming a second dielectric layer over the getter layer and the first dielectric layer;
    patterning the second dielectric layer to form a first cavity of the membrane type sensor;
    bonding a silicon layer to the second dielectric layer;
    patterning the substrate under the reference element; and
    removing a portion of the metal layer under the reference element via a plurality of holes.

12. The method of claim 11, wherein fabricating the bulk silicon sensor further comprises:
    patterning the second dielectric layer to provide a first cavity of the bulk silicon sensor; and
    patterning the silicon layer over the second portion of the substrate to form a plurality of silicon structures of the bulk silicon sensor.

13. The method of claim 11, wherein patterning the getter layer further comprises patterning the getter layer for the membrane type sensor and the bulk silicon sensor.

14. The method of claim 11, wherein patterning the getter layer further comprises patterning a Titanium layer.

15. The method of claim 11, wherein providing the first dielectric layer over the reference element further comprises patterning an oxide layer.

16. The method of claim 11, wherein patterning the second dielectric layer to form the first cavity of the membrane type sensor further comprises patterning an oxide layer.

17. The method of claim 11, wherein providing the reference element over the metal layer further comprises providing the reference element made of metal material.

18. The method of claim 11, wherein providing the reference element over the metal layer further comprises providing the reference element as an electrode of the membrane type sensor.

* * * * *